US012635481B2

(12) United States Patent
Nakamura

(10) Patent No.: US 12,635,481 B2
(45) Date of Patent: May 19, 2026

(54) CHUCK TABLE AND MANUFACTURING METHOD OF CHUCK TABLE

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 580 days.

(21) Appl. No.: 18/151,612

(22) Filed: Jan. 9, 2023

(65) Prior Publication Data

US 2023/0245914 A1 Aug. 3, 2023

(30) Foreign Application Priority Data

Jan. 28, 2022 (JP) ................................. 2022-011635

(51) Int. Cl.
*B23K 26/53* (2014.01)
*B24B 7/07* (2006.01)
(Continued)

(52) U.S. Cl.
CPC ................ *H10P 72/78* (2026.01); *B24B 7/07* (2013.01); *B24B 7/228* (2013.01); *H10P 52/00* (2026.01);
(Continued)

(58) Field of Classification Search
CPC . H01L 21/6875; H01L 21/6838; G03F 7/707; B25B 11/005; B23K 26/53;
(Continued)

(56) References Cited

U.S. PATENT DOCUMENTS 6,583,032 B1 * 6/2003 Ishikawa ................. H10P 54/00
438/114
12,165,933 B2 * 12/2024 Baek ................... H01L 21/6831
(Continued)

FOREIGN PATENT DOCUMENTS

JP 6233319 Y2 8/1987
JP 62249446 A 10/1987
(Continued)

OTHER PUBLICATIONS

Optics and Lasers in Engineering; Thermal cleavage on glass by a laser-induced plume (Year: 2013).*

(Continued)

*Primary Examiner* — Mahdi H Nejad

(74) *Attorney, Agent, or Firm* — Greer Burns & Crain Ltd.

(57) ABSTRACT

A chuck table includes a holding plate having a holding surface for holding the wafer under suction, and a frame body that supports the holding plate thereon and transmits a negative pressure or a positive pressure to the holding surface. The holding plate is formed such that a plurality of cleaved portions are included through cleavage of the holding plate into a plurality of blocks along a plurality of modified layers formed by applying a laser beam of a wavelength, which has transmissivity through the holding plate, with a focal point thereof positioned inside the holding (Continued)

plate, and the negative pressure or the positive pressure is transmitted from the cleaved portions to the holding surface. A grinding machine and a manufacturing method of the chuck table for holding the wafer are also disclosed.

15 Claims, 4 Drawing Sheets

(51) Int. Cl.
| | |
|---|---|
| *B24B 7/22* | (2006.01) |
| *H10P 52/00* | (2026.01) |
| *H10P 72/00* | (2026.01) |
| *H10P 72/78* | (2026.01) |
| *H10P 54/00* | (2026.01) |
| *H10P 72/70* | (2026.01) |

(52) U.S. Cl.
CPC .......... *H10P 72/0428* (2026.01); *H10P 54/00* (2026.01); *H10P 72/7402* (2026.01)

(58) Field of Classification Search
CPC B23K 2101/40; B23K 26/40; B23K 2103/50; H10P 54/00; H10P 72/0428
USPC .................... 269/21; 451/388; 279/3; 355/73
See application file for complete search history.

(56) References Cited

U.S. PATENT DOCUMENTS

| | | | | |
|---|---|---|---|---|
| 2011/0155706 A1* | 6/2011 | Nagatomo | ............. | B23K 26/53 |
| | | | | 219/121.72 |
| 2015/0332928 A1* | 11/2015 | Priewasser | .......... | H10P 72/7608 |
| | | | | 438/460 |
| 2019/0001433 A1* | 1/2019 | Yamamoto | ........... | B23K 26/032 |
| 2021/0057260 A1* | 2/2021 | Matsuzawa | ............. | H10P 52/00 |
| 2021/0327744 A1* | 10/2021 | Nakamura | ............. | H10P 54/00 |

FOREIGN PATENT DOCUMENTS

| | | |
|---|---|---|
| JP | 2009246098 A | 10/2009 |
| JP | 2021109258 A | 8/2021 |

OTHER PUBLICATIONS

Office Action issued in counterpart Japanese patent application No. 2022-011635, dated Jun. 24, 2025.
Office Action issued in counterpart Singapore patent application No. 10202300023W, dated Aug. 15, 2025.

* cited by examiner

CHUCK TABLE AND MANUFACTURING METHOD OF CHUCK TABLE

BACKGROUND OF THE INVENTION

Field of the Invention

The present invention relates to a chuck table for holding a wafer, a grinding machine, and a manufacturing method of the chuck table for holding a wafer.

Description of the Related Art

A wafer with a plurality of devices such as integrated circuits (ICs) or large-scale integration (LSI) circuits formed on a front surface thereof and separated by a plurality of intersecting streets is ground at a back surface thereof by a grinding machine to a desired thickness, and is then divided into individual device chips by a dicing machine or a laser processing machine. The divided device chips are used in electronic equipment such as mobile phones or personal computers.

The grinding machine is constructed including a chuck table that holds the wafer, a grinding unit that includes a grinding wheel for rotation with a plurality of grinding stones disposed in an annular pattern thereon to grind the wafer held on the chuck table, and a grinding water supply unit that supplies grinding water to the grinding stones and the wafer, and can process the wafer to the desired thickness (see, for example, Japanese Patent Laid-open No. 2009-246098).

In the meantime, attempts have been made to make a holding surface of a chuck table and a surface to be ground of a wafer parallel through grinding of the holding surface of the chuck table by a grinding unit. Nonetheless, a problem still remains unsolved in that the thickness of the wafer cannot be made uniform due to a difference in material between the wafer and the holding surface of the chuck table. To solve this problem, the present assignee proposed a technique that uses the same material for the wafer to be held by the chuck table and the holding surface of the chuck table (see Japanese Patent Laid-open No. 2021-109258).

SUMMARY OF THE INVENTION

It has, however, been found that, with a chuck table of any conventional configuration, the holding surface of the chuck table and a surface to be ground of a wafer are hardly made parallel with high precision even if the material of the wafer and the material of a member, which constitutes the holding surface of the chuck table, are made the same, and there is still a demand for a further improvement.

The present invention therefore has, as objects thereof, the provision of a chuck table capable of making a holding surface of a chuck table and a surface to be ground of a wafer parallel with high precision, a grinding machine, and a manufacturing method of the chuck table.

In accordance with a first aspect of the present invention, there is provided a chuck table for holding a wafer, including a holding plate having a holding surface for holding the wafer under suction, and a frame body that supports the holding plate thereon and transmits a negative pressure or a positive pressure to the holding surface. The holding plate is formed such that a plurality of cleaved portions are included through cleavage of the holding plate into a plurality of blocks along a plurality of modified layers formed by applying a laser beam of a wavelength, which has transmissivity through the holding plate, with a focal point thereof positioned inside the holding plate, and the negative pressure or the positive pressure is transmitted from the cleaved portions to the holding surface.

In accordance with a second aspect of the present invention, there is provided a grinding machine including a chuck table that holds a wafer, a grinding unit that includes a grinding wheel for rotation with a plurality of grinding stones disposed in an annular pattern thereon to grind the wafer held on the chuck table, and a grinding water supply unit that supplies grinding water to the grinding stones and the wafer. The chuck table includes a holding plate having a holding surface that holds the wafer thereon under suction, and a frame body that transmits a negative pressure or a positive pressure to the holding surface. The holding plate is formed such that a plurality of cleaved portions are included through cleavage of the holding plate into a plurality of blocks along a plurality of modified layers formed by applying a laser beam of a wavelength, which has transmissivity through the holding plate, with a focal point thereof positioned inside the holding plate, and the negative pressure or the positive pressure is transmitted from the cleaved portions to the holding surface.

In accordance with a third aspect of the present invention, there is provided a manufacturing method of a chuck table including a holding surface that holds a wafer thereon. The manufacturing method includes a base material providing step of providing a base material for a holding plate, a modified layer forming step of forming a plurality of modified layers by applying a laser beam of a wavelength, which has transmissivity through the base material, with a focal point thereof positioned inside the base material, a cleaving step of forming a plurality of cleaved portions by cleaving the base material into a plurality of blocks along the modified layers, and an integration step of integrating the holding plate, in which the cleaved portions have been formed, with a frame body that supports the holding plate thereon.

According to the chuck table of the present invention, the holding surface has a form close to the wafer to an extent that the cleaved portions formed in the holding surface cannot be almost recognized visually. If the material of the holding plate and the material of the wafer as a workpiece are made to conform to each other, the holding surface of the chuck table and the surface to be ground (back surface) of the wafer can be formed parallel to each other with high precision.

According to the grinding machine of the present invention, the holding surface has a form close to the wafer to an extent that the cleaved portions formed in the holding surface cannot be almost recognized visually. If the material of the holding plate and the material of the wafer as a workpiece are made to conform to each other, the holding surface of the chuck table and the surface to be ground (back surface) of the wafer can be formed parallel to each other with high precision.

According to the manufacturing method of this invention for the chuck table, the holding surface has a form close to the wafer to an extent that the cleaved portions formed in the holding surface cannot be almost recognized visually. If the material of the holding plate and the material of the wafer as a workpiece are made to conform to each other, it is possible to efficiently manufacture a chuck table capable of forming the holding surface of the chuck table and the surface to be ground (back surface) of the wafer parallel to each other with high precision.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

With reference to the attached drawings, a description will be made in detail about a chuck table 3 according to an embodiment of a first aspect of the present invention, a grinding machine 1 according to an embodiment of a second aspect of the present invention, and a manufacturing method according to an embodiment of a third aspect of the present invention for the chuck table 3.

Figure 1:
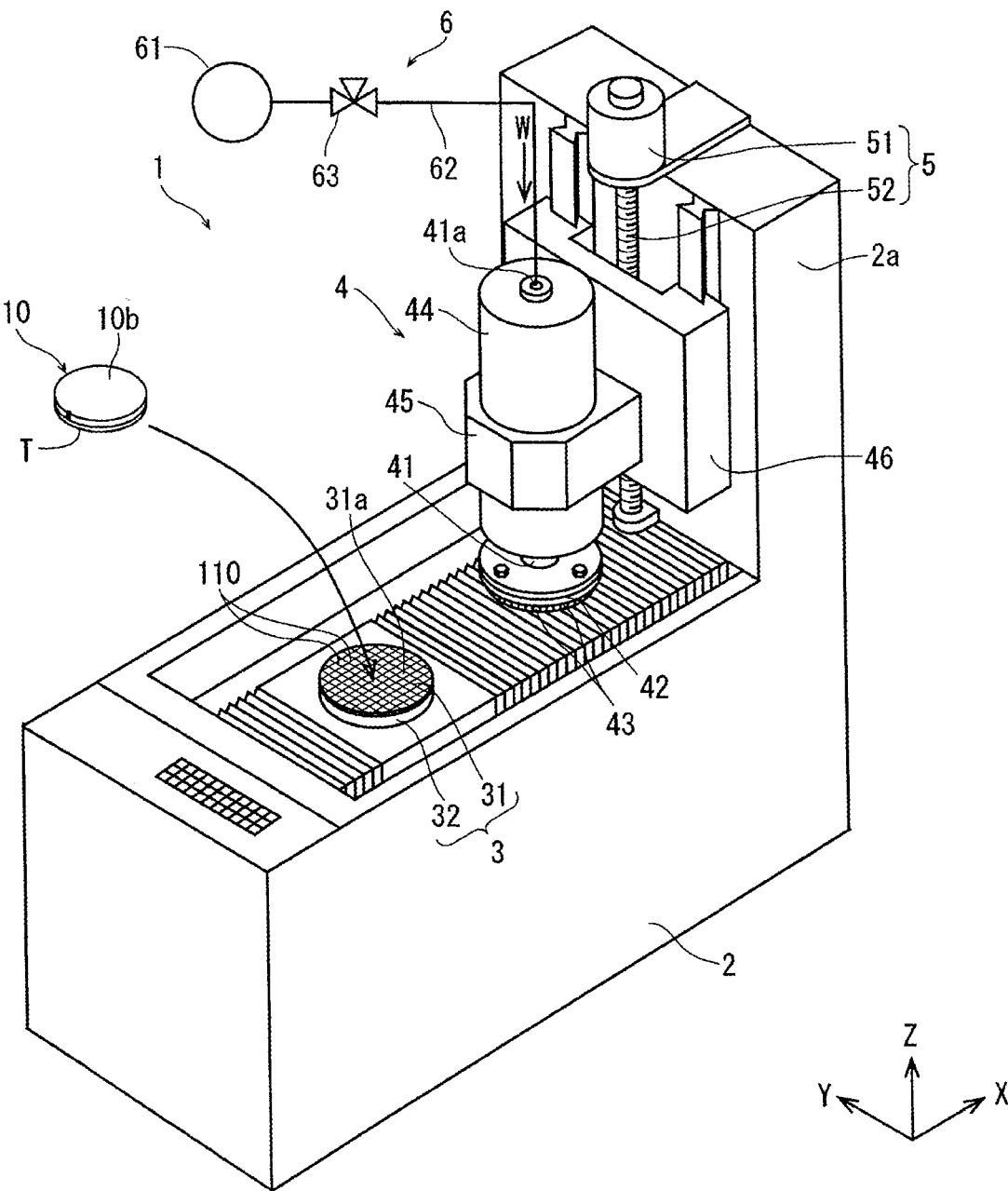
FIG. 1 is an overall perspective view of a grinding machine according to an embodiment of a second aspect of the present invention.

FIG. 1 is an overall perspective view of the grinding machine 1 according of the present embodiment, which includes the chuck table 3 of the present embodiment. The grinding machine 1 includes at least the chuck table 3 that holds a wafer 10 (for example, a silicon (Si) wafer) as a workpiece, a grinding unit 4 that grinds the wafer 10, which is held on the chuck table 3, at a back surface 10b thereof, a lift mechanism 5 that moves up and down the grinding unit 4 in a Z-axis direction (up-and-down direction), and a grinding water supply unit 6 that supplies grinding water W to grinding stones 43 of the grinding unit 4 and the wafer 10.

The chuck table 3 includes a holding plate 31 that has a holding surface 31a to hold the wafer 10 under suction, and a frame body 32 that supports the holding plate 31 and transmits a negative pressure or a positive pressure to the holding surface 31a. The chuck table 3 is configured to be rotatable by a rotary drive unit (not illustrated), and is moved by an X-axis moving mechanism (not illustrated), which is accommodated inside a machine housing 2, between a desired position in an X-axis direction, for example, a loading/unloading position on a near side in the figure, where the wafer 10 is loaded and unloaded, and a grinding processing position where grinding processing is applied right below the grinding unit 4.

The grinding unit 4 includes at least a spindle 41, a grinding wheel 42 disposed on a lower end of the spindle 41, the grinding stones 43 disposed in an annular pattern on a lower surface of the grinding wheel 42, an electric motor 44 that rotates the spindle 41, a support portion 45 supporting the grinding unit 4 thereon, and a Z-axis moving base 46 supported movably up and down together with the support portion 45 in the Z-axis direction on a vertical wall section 2a of the machine housing 2.

The lift mechanism 5 can convert rotary motion of a pulse motor 51 to linear motion via a ball screw 52 that is rotated by the pulse motor 51, can transmit the linear motion to the Z-axis moving base 46, and can move the grinding unit 4 to a desired position in the Z-axis direction (up-and-down direction). The grinding water supply unit 6 includes a grinding water supply source 61, a communication passage 62, and an on/off valve 63 that opens or closes the communication passage 62, and the communication passage 62 is connected to an upper end 41a of the spindle 41 of the grinding unit 4. The grinding water W supplied from the grinding water supply source 61 is supplied to the wafer 10, which is held on the chuck table 3, and the grinding stones 43, which grind the wafer 10, through an interior of the spindle 41 when grinding processing is performed. The grinding machine 1 includes a controller (not illustrated), and the above-described individual operating elements are controlled by control signals sent from the controller.

Figure 2A:
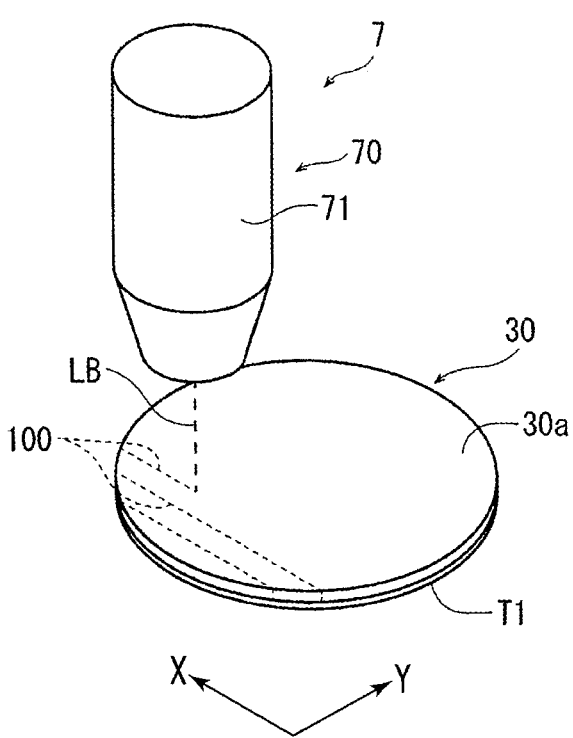
FIG. 2A is a perspective view illustrating a modified layer forming step in a manufacturing method according to an embodiment of a third aspect of the present invention for a chuck table according to an embodiment of a first aspect of the present invention, which is used in the grinding machine illustrated in FIG. 1.
Figure 2B:
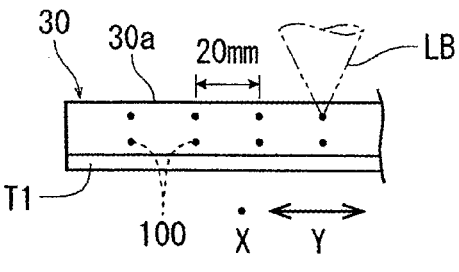
FIG. 2B is a cross-sectional view of a wafer (base material) in a modification of the modified layer forming step of FIG. 2A.
Figure 2C:
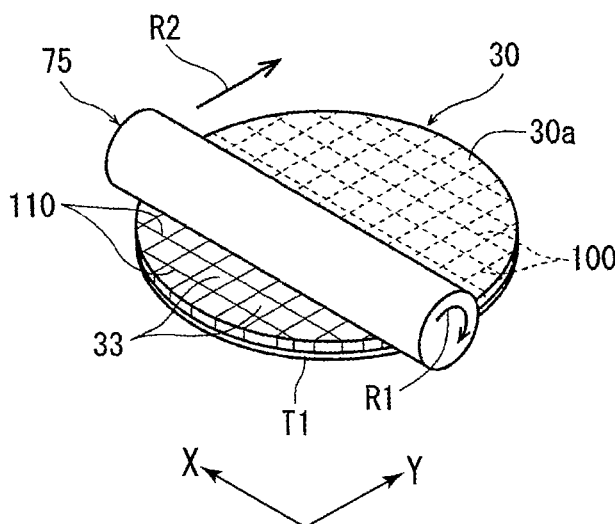
FIG. 2C is a perspective view illustrating a cleaving step in the manufacturing method of the chuck table.
Figures 3A, 3B, 4:
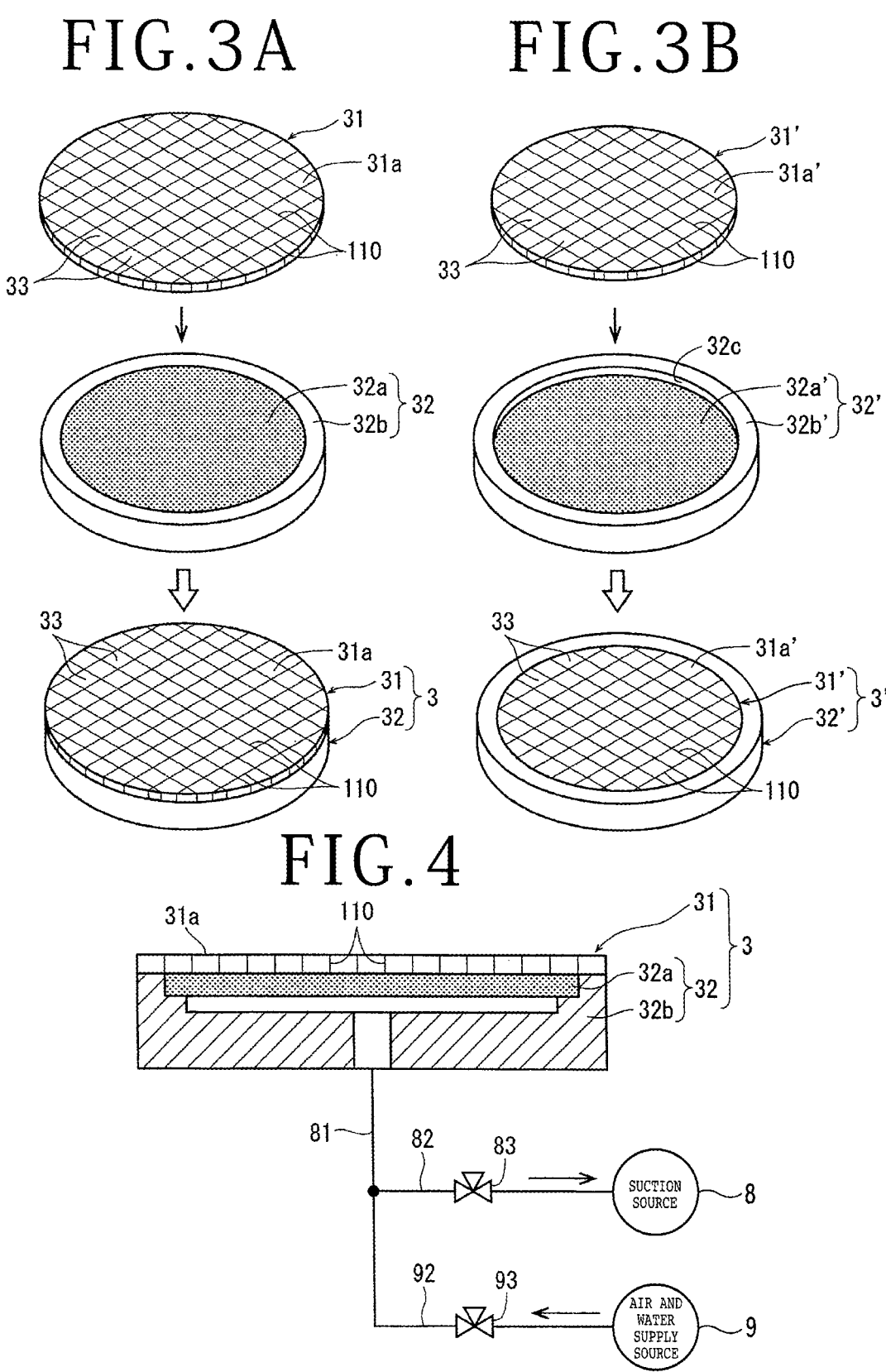
FIG. 3A is a perspective view illustrating an integration step in the manufacturing method of the chuck table.
FIG. 3B is a perspective view illustrating a modification of the integration step illustrating in FIG. 3A.
FIG. 4 is a partly cross-sectional, schematic view illustrating a fashion that connects a suction source and an air and water supply source to the chuck table illustrated in FIG. 3A.

With reference to FIGS. 2A, 2C, 3A, and 4, a description will hereinafter be made about the manufacturing method of the present embodiment for the chuck table 3, and the chuck table 3 formed by the manufacturing method. FIG. 2A is a perspective view illustrating a modified layer forming step in the manufacturing method for the chuck table 3, which is used in the grinding machine 1 illustrated in FIG. 1, FIG. 2C is a perspective view illustrating a cleaving step in the manufacturing method of the chuck table 3, FIG. 3A is a perspective view illustrating an integration step in the manufacturing method of the chuck table 3, and FIG. 4 is a partly cross-sectional, schematic view illustrating a fashion that connects a suction source 8 and an air and water supply source 9 to the chuck table 3 illustrated in FIG. 3A.

Upon performance of the manufacturing method of the present embodiment for the chuck table 3, a plate-shaped base material 30 (see FIG. 2A) is first provided as a base material for the holding plate 31 (base material providing step). The base material 30 has a disk shape having a larger diameter than that of the above-described wafer 10, and is formed, for example, with a thickness of 1 mm. A material (silicon (Si)) similar to the material of the wafer 10 to be held on the chuck table 3 is chosen. The wafer 10 does not include devices or the like formed thereon, has been subjected at front and back sides thereof to polishing processing, and includes an adhesive tape T1 bonded on and integrated with one of the front and back sides thereof. If the base material 30 has been provided, the base material 30 is transferred to a laser processing machine 7 illustrated only partly in FIG. 2A.

The laser processing machine 7 includes a holding table (not illustrated) and a laser beam application unit 70 that applies a laser beam LB of a wavelength having transmittivity through the base material 30 to be held on the holding table. The holding table includes an X-axis feeding mechanism (not illustrated) that relatively feeds the holding table and the laser beam application unit 70 for processing in the X-axis direction, a Y-axis feeding mechanism (not illustrated) that relatively feeds the holding table and the laser beam application unit 70 for indexing in the Y-axis direction orthogonal to the X-axis direction, and a rotary drive unit (not illustrated) that rotates the holding table.

If the above-described base material 30 has been transferred to the laser processing machine 7, the base material 30 is held under suction on the holding table with the side, where the adhesive tape T1 is bonded, directed downward and a side of a front surface 30a thereof directed upward. On the base material 30 held on the holding table, an alignment step is performed using an alignment unit (not illustrated) arranged in the laser processing machine 7, whereby a contour shape of the base material 30 is detected, predetermined positions on the front surface 30a, to which the laser beam LB is to be applied, are each detected in terms of X-coordinate and Y-coordinate, and position information regarding the predetermined position detected is stored in a controller (not illustrated).

Based on the position information detected through the above-described alignment step, a condenser 71 of the laser beam application unit 70 is positioned above a predetermined processing start point, and, as illustrated in FIG. 2A, the laser beam LB is applied with its focal point positioned inside the base material 30, and the base material 30 is fed together with the holding table for processing in the X-axis direction to form a modified layer 100. If the modified layer 100 has been formed along the X-axis direction, the base material 30 is fed for indexing by a predetermined interval in the Y-axis direction, and a Y-coordinate position to which the laser beam LB is to be applied next is positioned right below the condenser 71. In a similar manner as described above, the laser beam LB is then applied with its focal point positioned inside the base material 30, and the base material 30 is fed for processing in the X-axis direction to form another modified layer 100. Such laser processing is repeated to form a plurality of modified layers 100 with the predetermined intervals along the X-axis direction.

The base material 30 is next rotated by 90 degrees such that a direction orthogonal to the direction, in which the modified layers 100 have already been formed, is brought into alignment with the X-axis direction. In a similar manner as described above, the laser beam LB is then applied with its focal point positioned inside the base material 30, and an additional plurality of modified layers 100 are formed at the above-described predetermined intervals in the direction orthogonal to the modified layers 100 previously formed (modified layer forming step). By applying the modified layer forming step to the base material 30 as described above, the modified layers 100 are formed in a grid pattern in the base material 30. Now, referring to FIG. 2B, a modification of the modified layer forming step of FIG. 2A will hereinafter be described. FIG. 2B is a cross-sectional view of the base material 30 (wafer) in this modification. As illustrated in FIG. 2B, upon formation of the modified layers 100 with the focal point of the laser beam LB positioned inside the base material 30, the depth of the focal point may be changed such that two rows of modified layers 100 are formed at different depths at each predetermined processing position. Further, the intervals between the adjacent modified layers 100 in the base material 30 in the present embodiment are, for example, 20 mm.

In addition, laser processing conditions other than those described above in the above-described modified layer forming step are, for example, as follows.

Wavelength: 1,342 nm
Repetition frequency: 90 kHz
Average output power: 1 W
Processing feed rate: 500 mm/sec If the modified layers 100 have been formed in the grid pattern in the base material 30 through the above-described modified layer forming step, a cleaving roller 75 illustrated in FIG. 2C is positioned on the base material 30. The roller 75 is, for example, a rubber roller having elasticity. While pressing the base material 30, the roller 75 is rolled in a direction indicated by arrow R1 and, at the same time, is moved in a direction indicated by arrow R2, and an external force is applied to the base material 30. As a consequence, the base material 30 is cleaved into a plurality of blocks 33 along the modified layers 100 to form a plurality of cleaved portions 110 (cleaving step). When applying the external force to the base material 30 by the roller 75, it is preferred to apply the external force by the roller 75 in both the X-axis direction and the Y-axis direction.

By forming the cleaved portions 110 to cleave the base material 30 into the blocks 33 as described above, it is possible to complete the holding plate 31 which makes up the holding surface of the chuck table 3. Here, the above-described cleaved portions 110 are illustrated by clear solid lines for the sake of convenience of explanation. However, the cleaved portions 110 have been formed by cleaving the base material 30 along the modified layers 100, and the adhesive tape T1 is bonded to the one side of the base material 30. Therefore, the holding plate 31 does not come to pieces, and the shape of the holding plate 31 is maintained in a state that the cleaved portions 110 are closed to such an extent to make the cleaved portions 110 hardly recognizable visually.

If the cleaving step has been performed as described above, the holding plate 31 is positioned, as described in FIG. 3A, on the frame body 32 that constitutes the chuck table 3. The frame body 32 is configured of a disk-shaped porous plate 32a having air permeability and an outer frame portion 32b supporting the porous plate 32a at an outer periphery and bottom surface thereof, and an upper surface of the porous plate 32a and an upper surface of the outer frame portion 32b are flush with each other. As illustrated in FIG. 4, the suction source 8 is connected to the frame body 32 via a communication passage 81 and a communication passage 82, while the air and water supply source 9 is connected to the frame body 32 via the communication passage 81 and a communication passage 92. An on/off valve 83 is arranged in the communication passage 82, and an on/off valve 93 is arranged in the communication passage 92. A negative pressure can be transmitted through the frame body 32 by closing the on/off valve 93, opening the on/off valve 83, and at the same time, operating the suction source 8. On the other hand, the positive pressure can be transmitted by closing the on/off valve 83, opening the on/off valve 93, and at the same time, operating the air and water supply source 9 to supply a mixed fluid of air and water to the porous plate 32a through the fame body 32. It is to be noted that the grinding machine of the present invention is not limited to the grinding machine 1 of the above-described embodiment. For example, the air and water supply source 9 may be separated into an air supply source and a water supply source, which may be connected to the communication passage 81 via different paths, respectively. In this case, it is possible to transmit only air to the frame body 32 or to transmit only water to the frame body 32.

Referring back to FIG. 3A and continuing the explanation, the above-described holding plate 31 is mounted and fixed on and integrated with the above-described frame body 32 (integration step). No particular limitation is imposed on a method for fixing the holding plate 31 on the frame body 32. For example, a bond is supplied in an atomized form to a side of a lower surface of the holding plate 31, and the holding plate 31 is then brought on the side of the lower surface thereof into contact with the porous plate 32*a* and the outer frame portion 32*b*, both of which make up the frame body 32, so that the holding plate 31 is fixed on the porous plate 32*a* and the outer frame portion 32*b*. Although omitted from the holding plate 31 illustrated in FIG. 3A for the sake of convenience of explanation, when the holding plate 31 is fixed on the frame body 32, the holding plate 31 is fixed on and integrated with the frame body 32 with the side of the above-described adhesive tape T1 directed upward while the shape of the holding plate 31 is maintained by the adhesive tape T1. If the holding plate 31 has been integrated with the frame body 32 as described above, the adhesive tape T1 is peeled off from the holding plate 31, whereby the chuck table 3 is completed as illustrated in a bottom part of FIG. 3A.

The holding plate 31 and the frame body 32 are integrated together with the bond supplied in the atomized form to the lower surface of the holding plate 31, and, therefore, the above-described air permeability of the holding plate 31 and the porous plate 32*a* is not impaired. The negative pressure or the positive pressure transmitted to the upper surface of the porous plate 32*a* of the frame body 32 from the above-described suction source 8 or the air and water supply source 9 is also transmitted to the holding surface 31*a* of the holding plate 31 through the cleaved portions 110. On the grinding machine 1, the holding plate 31, which has been formed as described above, of the chuck table 3 is ground and planarized by the grinding stones 43 of the grinding unit 4 provided to grind the wafer 10. The grinding machine 1 includes a controller (not illustrated), and the above-described individual operating elements are controlled by control signals sent from the controller.

It is to be noted that the chuck table of this invention is not limited to the configuration of the chuck table 3 of the above-described embodiment, and may have, for example, a configuration illustrated in FIG. 3B. FIG. 3B is a perspective view illustrating a modification of the integration step illustrated in FIG. 3A. A holding plate 31' of a chuck table 3' illustrated in FIG. 3B has the same diameter as that of the wafer 10 as a workpiece, and is formed with a smaller diameter than the above-described holding plate 31. Therefore, this holding plate 31' has the same configuration as the holding plate 31 except that it has the small diameter compared with the above-described holding plate 31, and is formed through the above-described base material providing step, modified layer forming step, and cleaving step. A frame body 32' is formed by a porous plate 32*a'* and an outer frame portion 32*b'*. The porous plate 32*a'* is formed with the same diameter as that of the holding plate 31', and a recessed portion 32*c*, which has a depth of approximately 1 mm and accommodates the holding plate 31', is formed by the porous plate 32*a'* and the outer frame portion 32*b'* that supports the porous plate 32*a'* at an outer periphery and bottom surface thereof. As illustrated in FIG. 3B, the chuck table 3' illustrated in a bottom part of FIG. 3B is formed by fitting the holding plate 31' in the recessed portion 32*c* of the frame body 32' and performing the integration step to fix the holding plate 31' in the recessed portion 32*c* with a bonding material similar to the bond described above. The frame body 32' of the chuck table 3' is formed with the same material (Si) as the holding plate 31', and the holding plate

31' of the chuck table 3' and the outer frame portion 32*b'* of the frame body 32' are ground and planarized by the grinding stones 43 of the grinding unit 4 of the grinding machine 1.

The chuck table 3 of the present embodiment and the grinding machine 1, in which the chuck table 3 is used, generally have the configurations described above, and their functions and operations will be described hereinafter.

Figure 5A:
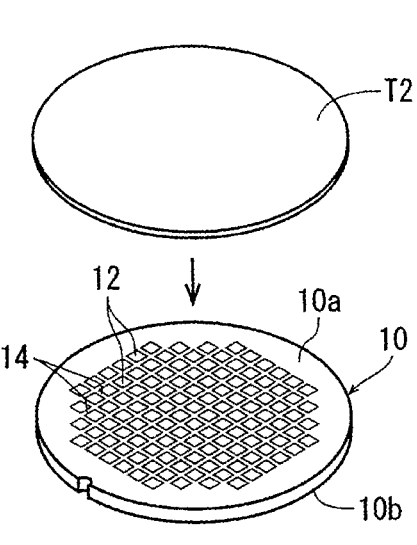
FIG. 5A is a perspective view illustrating how a protective tape is bonded to a front surface of the wafer.
Figure 5B:
FIG. 5B is a perspective view illustrating a fashion that holds the wafer on the chuck table illustrated in FIG. 3A.
Figure 5B:
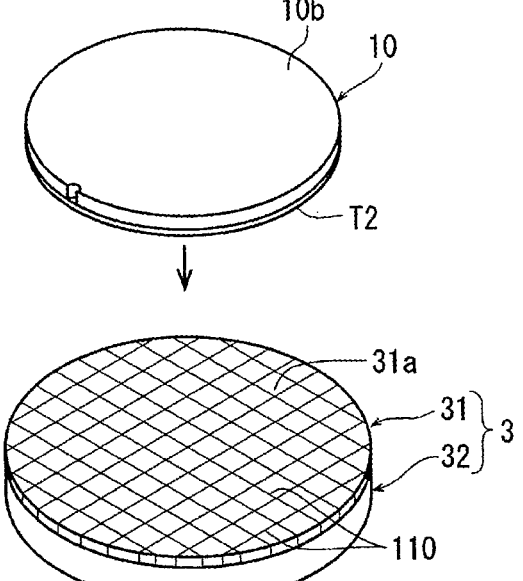
Figure 6:
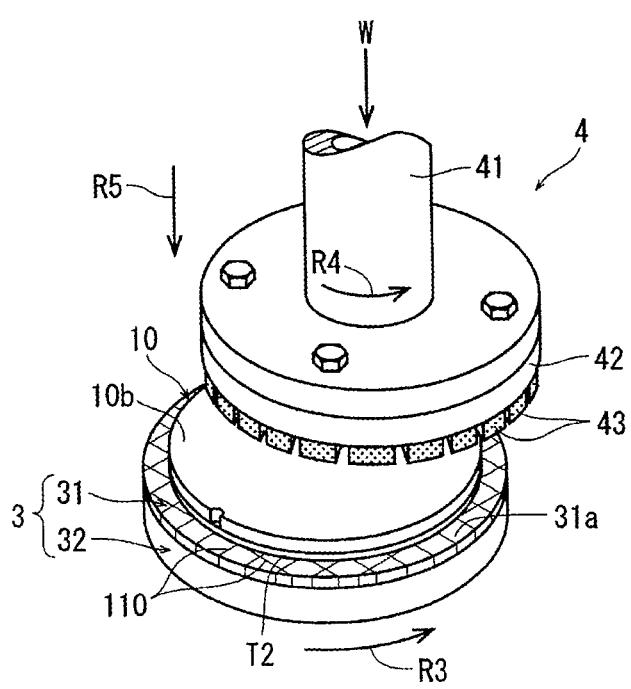
FIG. 6 is a perspective view illustrating a fashion that grinds the wafer by the grinding machine illustrated in FIG. 1.

FIG. 5A illustrates the wafer 10 to be processed by the grinding machine 1 of the present embodiment. The wafer 10 is a silicon (Si) wafer, and a plurality of devices 12 are formed on a front surface 10*a* and is divided by a plurality of intersecting streets 14. A protective tape T2 is bonded to the front surface 10*a* of the wafer 10, and as illustrated in FIG. 5B, the wafer 10 with the protective tape T2 bonded thereto is transferred to the chuck table 3 and is centrally placed on the holding plate 31. As described above, the cleaved portions 110 have been formed in the holding plate 31, and by operating the suction source 8 described based on FIG. 4, the wafer 10 is held under suction on the holding plate 31 by the negative pressure transmitted through the frame body 32 (see also FIG. 6 in combination). FIG. 6 is a perspective view illustrating a fashion that grinds the wafer 10 by the grinding machine 1 illustrated in FIG. 1.

The above-described X-axis moving mechanism is next operated to position the chuck table 3 at the grinding processing position right below the grinding unit 4. As illustrated in FIG. 6, the rotary drive unit (not illustrated) is then operated to rotate the chuck table 3 at a predetermined rotational speed (for example, 300 rpm) in a direction indicated by arrow R3, and at the same time, the electric motor 44 (see FIG. 1) is also operated to rotate the spindle 41 of the grinding unit 4 at a predetermined rotational speed (for example, 6,000 rpm) in a direction indicated by arrow R4. The above-described lift mechanism 5 is next operated to lower the grinding unit 4 in a direction indicated by arrow R5, whereby the grinding stones 43 are brought into contact with the back surface 10*b* of the wafer 10. At the same time, the above-described grinding water supply unit 6 is also operated to supply the grinding water W to the grinding stones 43 and the back surface 10*b* of the wafer 10 through the spindle 41. In this manner, the wafer 10 is ground and thinned to a predetermined thickness while the grinding unit 4 is fed at a predetermined rate (for example, 1 μm/sec) for grinding.

Further, as illustrated in FIG. 6, the holding plate 31 of the chuck table 3 is formed larger than the diameter of the wafer 10 such that a margin area is formed on an outer periphery of the wafer 10. The negative pressure is also transmitted to the margin area. However, cracks or crevices formed in the cleaved portions 110 are small compared with pores which provide the porous plate 32*a* with air permeability, and in addition, the cleaved portions 110 in the margin area on the outer periphery of the wafer 10 are sealed with the grinding water supplied during grinding, so that the wafer 10 is held well under suction on the chuck table 3. Further, when this grinding processing is performed, a thickness gauge (not illustrated) may be operated, thereby enabling to perform the grinding processing while measuring the thickness of the wafer 10.

According to the embodiments described above, the holding plate 31 of the chuck table 3 includes the cleaved portions 110 by which the base material 30 has been cleaved into the blocks 33 along the modified layers 100 formed by applying the laser beam LB of the wavelength, which has transmissivity through the holding plate 31, in other words, the base material 30, with the focal point thereof positioned inside the holding plate 31, and therefore is formed such that the negative pressure or the positive pressure is transmitted from the cleaved portions 110. According to the configuration described above, the holding plate 31 has a form close to the wafer 10 to an extent that the cleaved portions 110 formed in the holding surface 31a cannot be almost recognized visually, and moreover, the holding plate 31 is also approximate in structure to the wafer 10. If the material of the holding plate 31 and the material of the wafer 10 as a workpiece are made to conform to each other, the holding surface 31a of the chuck table 3 and the surface to be ground (back surface 10b) of the wafer 10 can be formed parallel to each other with high precision by grinding the holding surface 31a of the chuck table 3 beforehand with the grinding stones 43.

Further, if the chuck table 3' illustrated in FIG. 3B is used instead of the above-described chuck table 3, similar advantageous effects as those available from the above-described chuck table 3 can also be brought about. The holding plate 31' has a form close to the wafer 10 to an extent that the cleaved portions 110 formed in a holding surface 31a' cannot be almost recognized visually, and moreover, the holding plate 31' is also approximate in structure to the wafer 10. If the material of the holding plate 31' and the material of the wafer 10 as a workpiece are made to conform to each other, the holding surface 31a' of the chuck table 3' and the surface to be ground (back surface 10b) of the wafer 10 can be formed parallel to each other with high precision by grinding the holding surface 31a' of the chuck table 3' beforehand with the grinding stones 43.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A chuck table for holding a wafer, comprising:
a holding plate having a holding surface for holding the wafer under suction; and
a frame body that supports the holding plate thereon and transmits a negative pressure or a positive pressure to the holding surface,
wherein the holding plate is formed such that a plurality of cleaved portions are included through cleavage of the holding plate into a plurality of blocks along a plurality of modified layers formed by applying a laser beam of a wavelength, which has transmissivity through the holding plate, with a focal point thereof positioned inside the holding plate, and the negative pressure or the positive pressure is transmitted from the cleaved portions to the holding surface, wherein a width of each of the plurality of blocks is at least twice as large as a width of each of the plurality of cleaved portions, and
wherein an air and water supply source is connected to the frame body via a communication passage, such that operating the air and water supply source supplies a mixed fluid of air and water to a porous plate of the frame body.

2. A grinding machine comprising:
a chuck table that holds a wafer;
a grinding unit that includes a grinding wheel for rotation with a plurality of grinding stones disposed in an annular pattern thereon to grind the wafer held on the chuck table; and
a grinding water supply unit that supplies grinding water to the grinding stones and the wafer, wherein the chuck table includes a holding plate having a holding surface that holds the wafer thereon under suction, and a frame body that transmits a negative pressure or a positive pressure to the holding surface, and
wherein the holding plate is formed such that a plurality of cleaved portions are included through cleavage of the holding plate into a plurality of blocks along a plurality of modified layers formed by applying a laser beam of a wavelength, which has transmissivity through the holding plate, with a focal point thereof positioned inside the holding plate, and the negative pressure or the positive pressure is transmitted from the cleaved portions to the holding surface, wherein a width of each of the plurality of blocks is at least twice as large as a width of each of the plurality of cleaved portions, and
wherein an air and water supply source is connected to the frame body via a communication passage, such that operating the air and water supply source supplies a mixed fluid of air and water to a porous plate of the frame body.

3. A manufacturing method of a chuck table including a holding surface that holds a wafer thereon, comprising:
a base material providing step of providing a base material for a holding plate;
a modified layer forming step of forming a plurality of modified layers by applying a laser beam of a wavelength, which has transmissivity through the base material, with a focal point thereof positioned inside the base material,
a cleaving step of forming a plurality of cleaved portions by cleaving the base material into a plurality of blocks along the modified layers by applying an external force to the base material, and
an integration step of integrating the holding plate, in which the cleaved portions have been formed, with a frame body that supports the holding plate thereon,
wherein an air and water supply source is connected to the frame body via a communication passage, such that operating the air and water supply source supplies a mixed fluid of air and water to a porous plate of the frame body.

4. The chuck table according to claim 1, wherein the width of each of the plurality of blocks is at least five times as large as the width of each of the plurality of cleaved portions.

5. The chuck table according to claim 2, wherein the width of each of the plurality of blocks is at least ten times as large as the width of each of the plurality of cleaved portions.

6. The chuck table according to claim 1, wherein the width of each of the plurality of blocks is 20 mm.

7. The grinding machine according to claim 2, wherein the width of each of the plurality of blocks is at least five times as large as the width of each of the plurality of cleaved portions.

8. The grinding machine according to claim 7, wherein the width of each of the plurality of blocks is at least ten times as large as the width of each of the plurality of cleaved portions.

9. The grinding machine according to claim 2, wherein the width of each of the plurality of blocks is 20 mm.

10. The manufacturing method according to claim 3, wherein a width of each of the plurality of blocks is at least twice as large as a width of each of the plurality of cleaved portions.

11. The manufacturing method according to claim 10, wherein the width of each of the plurality of blocks is at least five times as large as the width of each of the plurality of cleaved portions.

12. The manufacturing method according to claim 11, wherein the width of each of the plurality of blocks is at least ten times as large as the width of each of the plurality of cleaved portions.

13. The manufacturing method according to claim 3, wherein the external force is applied by a roller.

14. The manufacturing method according to claim 13, wherein the roller is a rubber roller.

15. The manufacturing method according to claim 3, wherein, in the modified layer forming step, a depth of the focal point is changed such that two rows of the modified layers are formed at different depths inside the base material.

* * * * *